United States Patent
Kammler et al.

(10) Patent No.: US 7,005,358 B2
(45) Date of Patent: Feb. 28, 2006

(54) TECHNIQUE FOR FORMING RECESSED SIDEWALL SPACERS FOR A POLYSILICON LINE

(75) Inventors: Thorsten Kammler, Ottendorf-Okrilla (DE); Katja Huy, Dresden (DE); Christoph Schwan, Gebhardshain (DE)

(73) Assignee: Advanced Micro Devices, Inc., Austin, TX (US)

( * ) Notice: Subject to any disclaimer, the term of this patent is extended or adjusted under 35 U.S.C. 154(b) by 77 days.

(21) Appl. No.: 10/786,401

(22) Filed: Feb. 25, 2004

(65) Prior Publication Data

US 2005/0026380 A1   Feb. 3, 2005

(30) Foreign Application Priority Data

Jul. 31, 2003   (DE) ................................ 103 35 100

(51) Int. Cl.
    *H01L 21/336* (2006.01)
(52) U.S. Cl. .................................................. 438/303
(58) Field of Classification Search ................ 438/265, 438/303, 595
    See application file for complete search history.

(56) References Cited

U.S. PATENT DOCUMENTS

| | | | |
|---|---|---|---|
| 6,017,823 A | 1/2000 | Shishiguchi et al. | 438/696 |
| 6,498,067 B1 | 12/2002 | Perng et al. | 438/305 |
| 2003/0011080 A1 | 1/2003 | Deshpande et al. | 257/900 |
| 2003/0027414 A1 * | 2/2003 | Ko | 438/595 |
| 2004/0005750 A1 * | 1/2004 | Chen et al. | 438/197 |

\* cited by examiner

*Primary Examiner*—Asok Kumar Sarkar
(74) *Attorney, Agent, or Firm*—Williams, Morgan & Amerson, P.C.

(57) ABSTRACT

In a double-spacer or multi-spacer approach to the formation of sophisticated field effect transistors, an upper sidewall portion of a gate electrode may be effectively exposed during recessing of an outer spacer element, since the outer spacer is substantially comprised of the same material as the liner material. Consequently, the anisotropic etch process for recessing the outer sidewall spacer also efficiently removes liner residues on the upper sidewall portion and provides an increased diffusion path for a refractory metal. Additionally, the lateral extension of the silicide regions on the drain and source area may be increased by correspondingly controlling an isotropic etch process for removing oxide residues.

33 Claims, 5 Drawing Sheets

TECHNIQUE FOR FORMING RECESSED SIDEWALL SPACERS FOR A POLYSILICON LINE

BACKGROUND OF THE INVENTION

1. Field of the Invention

The present invention generally relates to the formation of integrated circuits, and, more particularly, to the formation of polysilicon lines, such as gate electrodes, requiring the exposure of upper sidewall portions thereof so as to provide an increased surface area for the formation of a metal silicide.

2. Description of the Related Art

Presently, the vast majority of integrated circuits is manufactured on the basis of silicon with critical feature sizes on the order of 0.1 μm and even less. The fabrication of transistor elements representing the dominant components of active circuits typically requires, among others, a controlled introduction of dopants into precisely defined silicon regions. One circuit architecture, which is currently the preferred technology owing to the superior performance with respect to power consumption, requires the formation of highly doped silicon regions with an inversely doped channel region disposed therebetween, wherein the conductivity of the channel region is controlled by an electric field generated by applying a control voltage to a gate electrode located in the vicinity of the channel region and separated therefrom by a gate insulation layer. Hence, a reduction in size of the transistor element necessitates the reduction of the distance between the highly doped silicon regions. This distance represents an important design criterion and is also referred to as the "channel length." In currently favored CMOS technologies, the gate electrode is patterned prior to the formation of the highly doped silicon regions, also referred to as "drain region and source region," so as to obtain the transistor geometry, i.e., the spatial relationship between the gate electrode, the drain region and the source region, in a self-aligned manner. Reducing the channel length, therefore, also requires a corresponding reduction of the size of the gate electrode. Generally, the gate electrode may be considered as a line-like circuit feature, the width of which is related to the corresponding channel length and is thus also referred to as the "gate length."

Since the formation of the transistor elements, especially the creation of an appropriately-shaped dopant profile in the drain and source regions, requires a plurality of high temperature processes, polysilicon is the preferred material for the gate electrode due to the superior and well understood characteristics of the silicon/silicon dioxide interface as silicon dioxide is frequently used as the gate insulation layer separating the channel region from the gate electrode. Although the provision of the polysilicon gate electrode prior to the formation of the drain and source regions assures a self-aligned transistor geometry, it turns out that complex, precisely-defined dopant profiles in the lateral direction are necessary to provide the required transistor performance of extremely scaled transistor devices. For this reason, so-called "sidewall spacers" are formed on sidewalls of the gate electrode, which may be considered as dielectric extensions of the gate electrode so as to correspondingly design the lateral dimensions of the gate electrode, which acts as an implantation mask during a plurality of implantation sequences for creating the required dopant profile. Since the dimensions of the sidewall spacers substantially determine the finally obtained dopant profile, the formation of the sidewall spacers may be carried out in two steps so as to provide superior process control during the formation of a first sidewall spacer and a subsequent formation of a second sidewall spacer, wherein, depending on process requirements, corresponding implantation cycles may be performed during the various stages of the spacer fabrication process.

With reference to FIGS. 1a–1d, a typical conventional process flow for forming a gate electrode is described, including first and second sidewall spacers so as to provide a lateral dopant profile required for extremely scaled transistor devices.

In FIG. 1a, a transistor element 100 comprises a substrate 101, for instance a bulk silicon substrate or a silicon-on-insulator (SOI) substrate, including a crystalline silicon region 103, which also may be referred to as an "active region," that is enclosed by an isolation structure 102 that is usually provided in the form of a trench isolation structure in sophisticated devices. A polysilicon gate electrode 104 is formed on a gate insulation layer 105, for instance, provided in the form of a silicon dioxide layer, which separates the gate electrode 104 from a channel region 106. The horizontal extension of the gate electrode 104 in FIG. 1a is referred to as the "gate length." A dielectric liner 107 comprised of silicon dioxide is formed on the sidewalls 109 of the gate electrode 104 as well as on the top surface thereof and on other surface portions of the transistor 100. Furthermore, recessed sidewall spacers 108 are formed on the liner 107 so as to not cover an upper portion 110 of the gate electrode 104.

A typical process flow for forming the transistor 100 as shown in FIG. 1a may include the following processes. After formation of the trench isolation structure 102 by means of sophisticated photolithography, etch and deposition techniques, implantation cycles may be performed so as to provide a required vertical dopant profile (not shown) in the active region 103. Thereafter, an insulating layer having a required thickness and composition suitable for the gate insulation layer 105 may be formed, for instance by well-established oxidation and/or deposition techniques. Next, a polysilicon layer of a specified thickness may be deposited and patterned in combination with the insulating layer by highly advanced photolithography and etch techniques so as to form the gate electrode 104 and gate insulation layer 105. Then, an ion implantation process may be performed to form doped extension regions 111, wherein the gate electrode 104 is used as an implantation mask. Thereafter, the liner 107 may be formed, for instance by the deposition of silicon dioxide, or by an oxidation process. Subsequently, a silicon nitride layer is conformally deposited with a predefined thickness that substantially determines a finally obtained width of the sidewall spacer 108. Thereafter, the silicon nitride layer is anisotropically etched with an etch chemistry that exhibits a high selectivity with respect to silicon dioxide. During the anisotropic etch process, the etch time may be controlled so as to adjust a degree of recessing the sidewall spacer 108, thereby determining the size of the exposed upper sidewall portion 110. Due to the high etch selectivity provided by the etch chemistry, the etch process is reliably stopped on exposed portions of the silicon dioxide liner 107. After recessing the sidewall spacer 108, the transistor 100 is exposed to a further anisotropic etch atmosphere comprised of an etch chemistry that removes silicon dioxide selectively to silicon.

FIG. 1b schematically shows the transistor device 100 after completion of the anisotropic silicon dioxide etch process. Due to the anisotropic nature of the silicon dioxide etch, the upper sidewall portion 110 is not completely exposed, resulting in silicon dioxide residues 112. After the formation of the sidewall spacers 108, a further ion implantation cycle may be performed so as to correspondingly modify the lateral dopant profile in the regions 111 or, depending upon the process technology used, a second sidewall spacer may be formed prior to carrying out the respective implantation cycles so as to obtain the desired lateral dopant profile. Providing a first sidewall spacer, i.e., the sidewall spacer 108, prior or between sophisticated implantation cycles may significantly improve the overall transistor characteristics in that the spacer width may be controlled more precisely and/or the dopant profile may be modified with a finer lateral "resolution."

FIG. 1c schematically shows the transistor device 100 in an advanced manufacturing stage, wherein second sidewall spacers 115 comprised of silicon nitride are formed at the first sidewall spacers 108, wherein a further liner oxide 114 separates the spacers 108 and 115. As previously explained, by means of the first and second sidewall spacers 108 and 115, the lateral dopant profile in the active region 103 may be appropriately shaped so as to form the extension 111 and corresponding drain and source regions 113. Moreover, the sidewall spacers enable the formation of highly conductive metal silicide on the drain and source regions 113 and on the gate electrode 104 in a self-aligned manner. Although the gate electrode 104 has received a dopant dose corresponding to the dose used to form the drain and source regions 113 and the extension 111, the resistance of polysilicon is still significantly higher than a metal, such as aluminum, and may lead to an intolerable signal propagation delay during operation of the device 100. Especially, as the gate length is reduced, the reduced cross-sectional area, in combination with an insufficient doping concentration in the vicinity of the gate insulation layer 105, may therefore lead to an increased gate line resistance.

In an attempt to reduce the resistivity of doped silicon regions, it has become standard practice to form a metal silicide on the drain and source regions 113 and the gate electrode 104. Since these metal silicide regions are formed in a common process sequence, the depth of the metal silicide formed on the gate electrode 104 is restricted by the depth of the drain and source regions 113 as the metal silicide may not extend into the inversely doped active region 103. As a matter of fact, a reduced gate length, and thus a reduced transistor dimension, however, requires the provision of extremely shallow source and drain regions 113 in combination with an extremely thin gate insulation layer so as to assure the desired controllability of the transistor 100. Consequently, the corresponding thickness of a metal silicide region on top of the gate electrode 104 is restricted by the requirements of shallow drain and source regions and thus the increase in resistivity of a dimensionally scaled gate electrode may not be compensated for as efficiently as is required. Therefore, the upper portion 110 of the sidewall 109 is exposed so as to provide an increased diffusion path during the chemical reaction between the metal and silicon in the gate electrode 104, thereby providing an increased metal silicide region therein. For this reason, the first and second spacers 108 and 115 are recessed to allow the exposure of an increased surface portion of the gate electrode 104 while providing the required lateral shaping of the dopant profile.

Thus, after removing the exposed portions of the silicon dioxide liner 114 by a selective anisotropic etch process and a subsequent cleaning process for removing oxide residues, a refractory metal, such as cobalt, is deposited over the transistor 100 and a heat treatment is performed to initiate a chemical reaction between the refractory metal and the silicon.

FIG. 1d schematically shows the transistor 100 with a cobalt layer 116 formed thereon. Even though a clean process is performed, the residues 112, 117 of the liner oxides 107 and 114 may still be present, resulting from the preceding anisotropic selective etch process. Hence, the upper sidewall portion 110 is not completely exposed and thus the cobalt diffusion is significantly hindered, resulting in a reduced cobalt silicide formation. Since the height of the first and the second spacers 108 and 115 may not be reduced arbitrarily so as to not unduly compromise the blocking effect during the implantation cycles, the silicon dioxide residues 112, 117 remarkably compromise the effective increase of conductivity.

Therefore, a need exists for an improved technique that enables the formation of recessed sidewall spacers, wherein at least some of the problems identified above may be eliminated or at least significantly reduced.

SUMMARY OF THE INVENTION

Generally, the present invention is directed to a technique for sequentially forming at least first and second recessed sidewall spacers on sidewalls of a semiconductor line element, such as a polysilicon gate electrode, wherein the metal diffusion into the semiconductor line is enhanced compared to conventional techniques.

In one embodiment, at least the outer sidewall spacer is comprised of a material having substantially the same etch rate as a material forming the innermost portion of a first sidewall spacer that is in contact with the semiconductor line. For instance, the outer sidewall spacer may be comprised of silicon dioxide so that, during a selective anisotropic etch process for creating the outer sidewall spaces, a liner oxide used during the formation of the inner sidewall spacer may also be simultaneously removed. Consequently, an upper portion of a semiconductor line, such as a polysilicon line, may be exposed for metal inter-diffusion more efficiently than in conventional techniques.

According to another illustrative embodiment of the present invention, a method comprises the formation of a recessed first sidewall spacer adjacent to a sidewall of a polysilicon line that is formed above a substrate, wherein the first sidewall spacer exposes an upper sidewall portion of the polysilicon line. A second sidewall spacer is formed adjacent to the first sidewall spacer, wherein the second sidewall spacer has a predefined etch selectivity with respect to the polysilicon line and the substrate. Furthermore, a size of the second sidewall spacer is reduced by a selective etch process according to the predefined etch selectivity so as to expose at least the upper sidewall portion. Finally, a metal silicide region is formed at least on the exposed upper sidewall portion.

According to still another illustrative embodiment of the present invention, a method comprises the formation of a silicon dioxide liner on the sidewalls of a polysilicon line that is formed above a silicon region. A recessed first sidewall spacer is formed on the silicon dioxide liner and a silicon dioxide sidewall spacer is formed adjacent to the first sidewall spacer. Finally, silicon dioxide is selectively removed at least on portions of the polysilicon line that are not covered by the first sidewall spacer.

According to yet another illustrative embodiment of the present invention, a method of forming a field effect transistor comprises the formation of a gate electrode above a region that is comprised of a specified semiconductive material on a gate insulation layer. Moreover, a first recessed sidewall spacer comprising at least a layer of a first dielectric material in contact with the gate electrode is formed and a second sidewall spacer comprised of the first dielectric material is formed, wherein the first dielectric material has a specified etch selectivity with respect to the specified semiconductive material. A drain region and a source region are also formed and a portion of the first dielectric material is selectively removed to substantially completely expose an upper sidewall portion of the gate electrode. Finally, a metal/semiconductor compound region is formed in the gate electrode, wherein the exposed upper sidewall portion promotes metal diffusion into the gate electrode.

BRIEF DESCRIPTION OF THE DRAWINGS

The invention may be understood by reference to the following description taken in conjunction with the accompanying drawings, in which like reference numerals identify like elements, and in which.

Figure 1A:
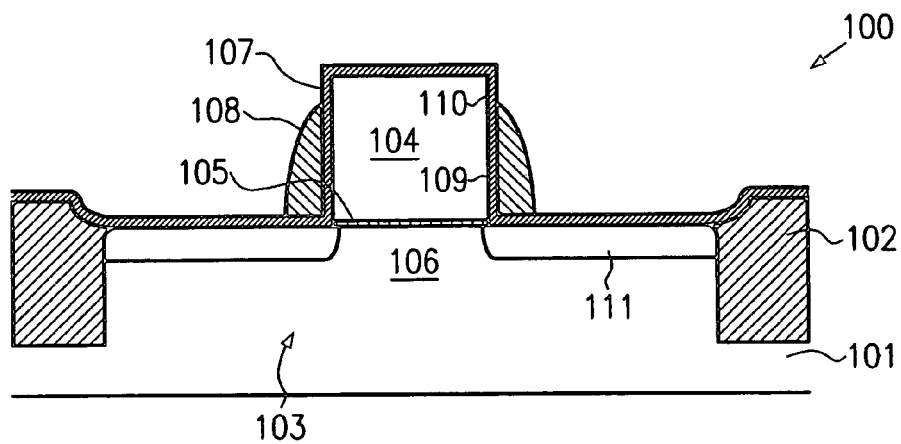
FIGS. 1a–1d schematically show cross-sectional views of a typical conventional process flow for forming recessed sidewall spacer elements of a gate electrode.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In the following, further illustrative embodiments will be described in more detail, wherein reference is made to a silicon-based field effect transistor having a polysilicon gate electrode in which a metal silicide region is formed to enhance the electrical sheet resistance thereof. It should be appreciated, however, that the principles of the present invention may also be applied to any polysilicon lines and features requiring a significant reduction of resistivity by means of a self-aligned silicidation process. Hence, the present invention should not be considered as being restricted to a gate electrode of a field effect transistor unless such restrictions are explicitly set forth in the appended claims.

With reference to FIGS. 2a–2c, 3a–3c and 4a–4c, further illustrative embodiments will now be described, wherein similar or identical components are denoted by the same reference numeral except for the very first digit, which is selected in correspondence with the number of the respective figure.

Figure 2A:
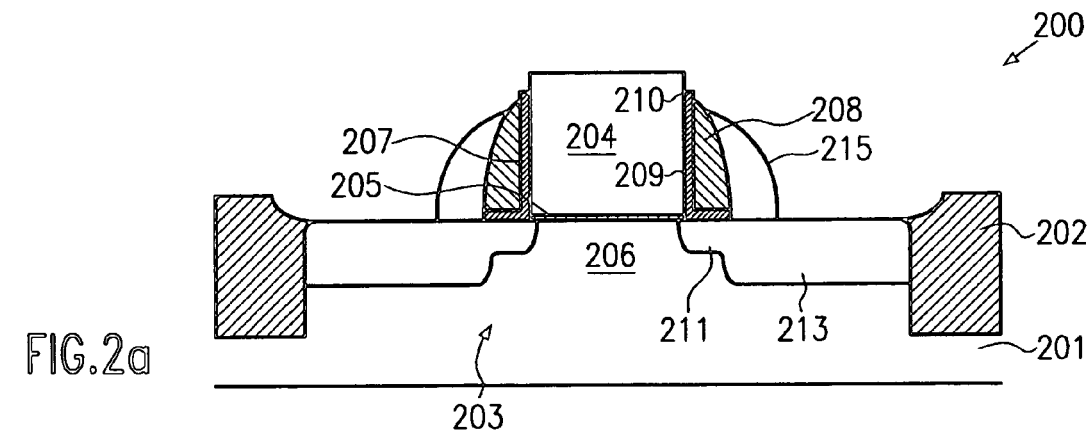
FIGS. 2a–2c schematically show cross-sectional views of a transistor element during the formation of recessed sidewall spacers, exposing an increased sidewall portion in accordance with illustrative embodiments of the present invention.

FIG. 2a schematically shows a cross-sectional view of a transistor element 200 comprising a substrate 201, such as a silicon substrate, an SOI substrate or any other semiconductor substrate having formed thereon a substantially crystalline semiconductor region 203, which is also referred to as an "active region" and which is enclosed by an isolation structure 202. In the following, it is assumed that the active region 203 is substantially comprised of silicon, wherein other semiconductor compositions may be used when considered appropriate. Drain and source regions 213, including respective extensions 211, are formed in the active region 203 and define a channel region 206 therebetween. A gate electrode 204 comprised of, for example, polysilicon, is formed above the channel region 206 and is separated therefrom by a gate insulation layer 205. A first sidewall spacer 208 is formed adjacent to a sidewall 209 of the gate electrode 204, wherein a liner 207 comprised of a first dielectric material, such as silicon dioxide, separates the sidewall 209 from the first sidewall spacer 208. The first sidewall spacer 208 is recessed so as to not cover an upper sidewall portion 210 of the gate electrode 204. In a typical example, the upper sidewall portion 210 may have an extension in the depth direction of approximately 10–50 nm, depending on the initial thickness of the gate electrode 204. Recessing of the first sidewall spacer 208 for defining the upper sidewall portion 210 is preferably performed such that a sufficient blocking effect in subsequent implantation processes with specified implantation parameters is achieved. A second sidewall spacer 215 is formed on the first sidewall spacer 208 and may be comprised, according to one particular embodiment, of the first dielectric material. The first dielectric material is selected so as to enable the establishment of anisotropic and/or isotropic etch chemistries having a required etch selectivity with respect to the material of the drain and the source regions 213 and the gate electrode 204. For instance, when the first dielectric material is silicon dioxide and the transistor 200 is a silicon-based device, corresponding selective etch recipes are well established in the art. In one particular embodiment, the first sidewall spacer 208 is comprised of silicon nitride, which in turn exhibits a high etch selectivity to silicon dioxide.

Figure 1B:
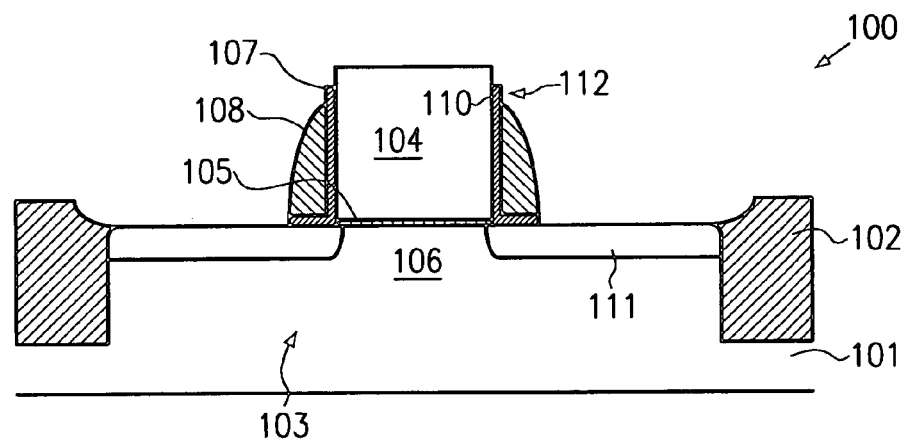
Figure 1C:
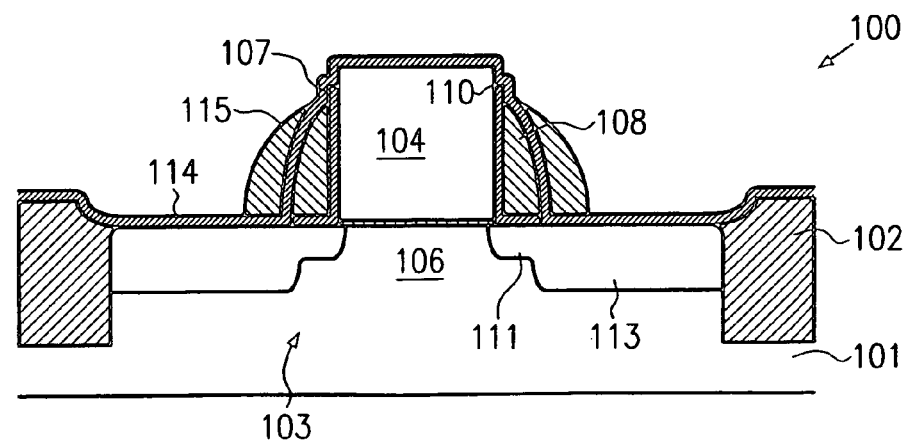
Figure 1D:
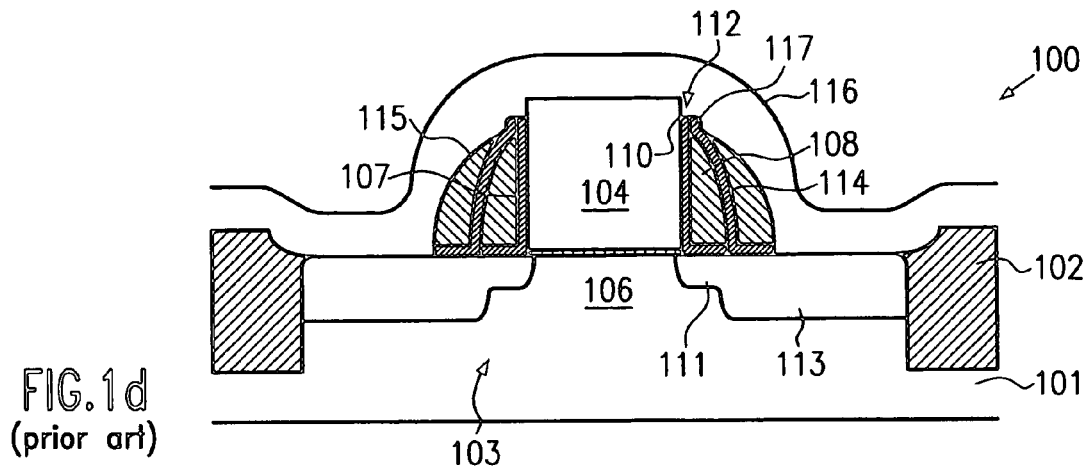

A typical process flow may comprise similar processes as already described with reference to FIGS. 1a–1c. That is, the formation of the trench isolation 202, the patterning of the gate electrode 204 and of the gate insulation 205, the deposition and etching of respective material layers for the liner 207 and the first sidewall spacer 208 may be performed by using well-established processes. The anisotropic etch process for forming the first sidewall spacer 208 is controlled so as to obtain the required degree of recess to expose the upper sidewall portion 210 and the corresponding liner material 207. Thereafter, a further anisotropic etch process may be performed to remove the liner material 207 on horizontal surface portions with an etch chemistry having a high selectivity to the material of the gate electrode 204 and the drain and source regions 213, as is similarly explained with reference to FIG. 1a. Consequently, the upper sidewall portion 210 may still remain partially covered by the liner 207 as shown in FIG. 2a. In other embodiments (not shown), the anisotropic etch of the liner 207 may be omitted and, depending on process requirements, further implantations may be carried out through the liner 207.

Then, a layer comprised of the first dielectric material may be conformally deposited with a thickness corresponding to a width of the second spacer 215. Next, the second sidewall spacer 215 is patterned by an anisotropic etch process, wherein the predefined etch selectivity between the first dielectric material and the semiconductor material prevents undue material removal from exposed semiconductor areas on the gate electrode 204 and the drain and source regions 213 when a desired over-etch time is applied to correspondingly adapt the height of the second spacer 215 to the height of the already recessed first sidewall spacer 208. Contrary to the conventional approach, during recessing of the second sidewall spacer 215, the liner 207 is also etched, thereby substantially further exposing the upper sidewall portion 210. Thereafter, further implantation cycles and anneal processes may be performed to obtain the finally required lateral dopant profile of the drain and source regions 213 and the extensions 211. Consequently, contrary to the conventional process flow, after the formation of the second sidewall spacer 215, the upper sidewall portion 210 is substantially exposed while the same lateral dopant profile and, thus, substantially the same transistor properties, are obtained as in the conventional case. Advantageously, a deposition sequence for forming a liner between the first and the second sidewall spacers is rendered obsolete, thereby improving process efficiency. Furthermore, as discussed above, in some embodiments, an anisotropic etch process for removing the liner 207 may be avoided to further reduce production costs.

Figure 2B:
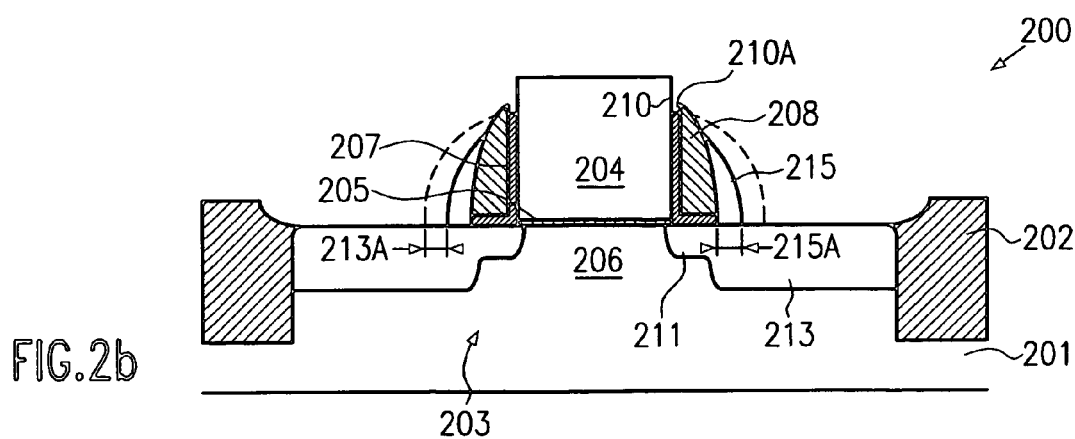

FIG. 2b schematically shows the transistor device 200 after a clean process has been performed to remove oxide residues from exposed surface portions. In one embodiment, a wet chemical oxide etch process may be employed on the basis of diluted hydrogenated fluoride (HF) to efficiently remove oxide residues, especially from the upper sidewall portion 210. In embodiments, wherein the first dielectric material comprises a material other than silicon dioxide, a correspondingly adapted etch chemistry may be applied to remove the material residues. In other embodiments, an isotropic dry etch process may be performed to substantially completely remove residues of the liner 207 on the upper sidewall portion 210 and, of course, from other exposed surface portions. During the isotropic etch process for removing the material residues, the overall size of the second sidewall spacer 215 is also reduced, wherein a reduced width 215A of the sidewall spacer 215 enables the exposure of an additional surface portion 213A of the drain and source regions 213, which is available for the following silicidation process. In some embodiments, therefore, the isotropic etch process for removing material residues of the first dielectric material may be controlled, for example, by appropriately adjusting the etch time, to obtain a required lateral extension of exposed surface area of the drain and source regions 213 to reduce a contact resistance by providing an increased silicide area.

In some embodiments, as shown, the isotropic etch process may create an "under-etch" area 210A between the sidewall 209 and the first sidewall spacer 208. In some embodiments, this under-etch region 210A may extend to approximately 5–20 nm and may be considered advantageous as long as the mechanical integrity of the sidewall spacer 208 is not unduly compromised.

Figure 2C:
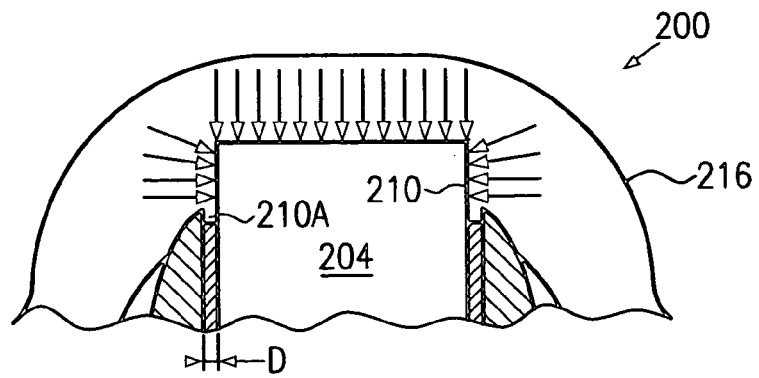

FIG. 2c schematically shows a portion of the transistor 200 with a layer 216 of refractory metal, such as cobalt, titanium, nickel and the like, wherein the diffusion area of the refractory metal into the gate electrode 204 is enlarged by substantially completely exposing the upper sidewall portion 210 during a heat treatment for initiating a chemical reaction. Consequently, a thicker metal/semiconductor compound, such as a metal silicide, may form in the gate electrode 204, compared to the conventional process flow. The increased metal silicide region thus allows the effective compensation for a reduced cross-sectional area caused by the ongoing size reduction of transistor elements, wherein, additionally, the contact resistance to the drain and source regions may also be reduced due to the enlarged lateral extension of the corresponding metal silicide (see FIG. 2b).

In embodiments having the under-etch area 210A, the initial thickness D of the liner 207 may be selected so that the under-etch area 210A may be reliably filled with the refractory metal 216. To this end, the initial thickness of the layer for forming the first sidewall spacer 208 has to be re-adjusted to correspondingly reduce the spacer width and to obtain the required overall width of the liner 207 and the spacer 208. In one illustrative embodiment, the thickness of the liner 207 may range from approximately 3–10 nm. A correspondingly formed under-etch area 210A may be reliably filled by sputter deposition during the formation of the refractory metal layer 216 and thus provide an increased diffusion path for silicidation.

Figure 3A:
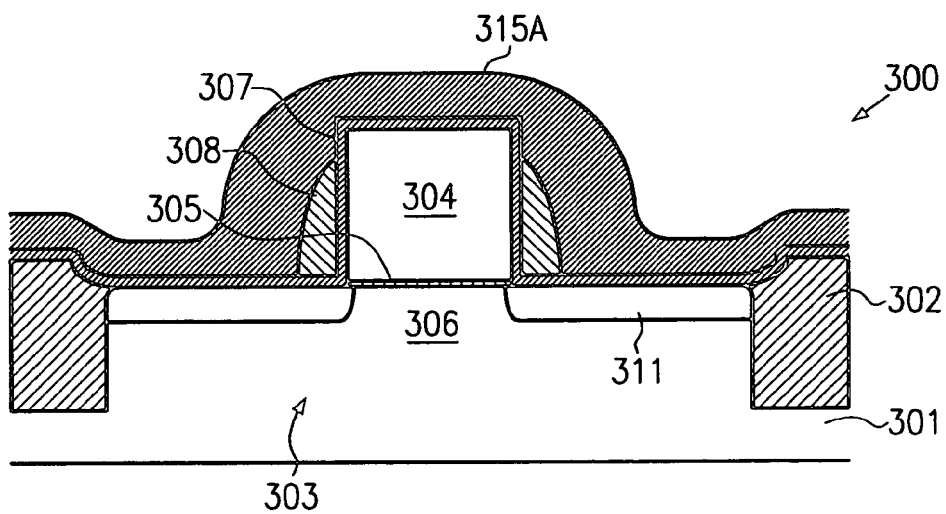
FIGS. 3a–3c schematically show cross-sectional views of a transistor element during various manufacturing stages in forming recessed sidewall spacers according to further illustrative embodiments of the present invention.
Figure 3B:
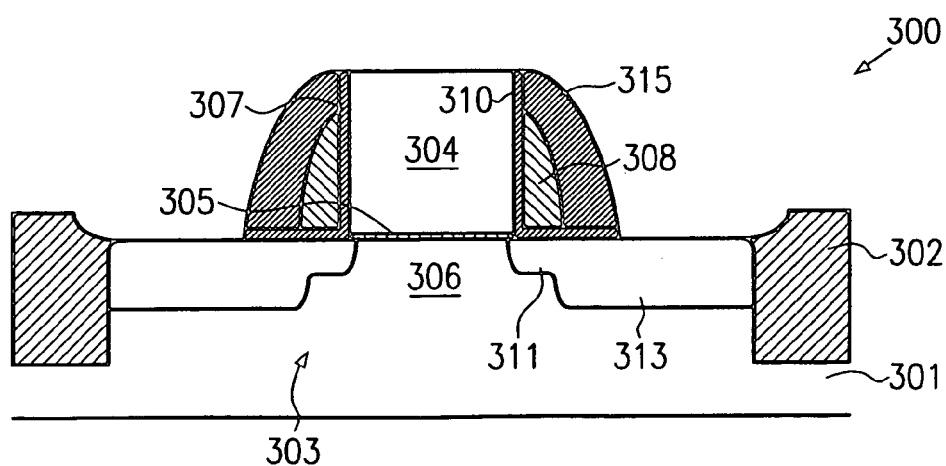
Figure 3C:
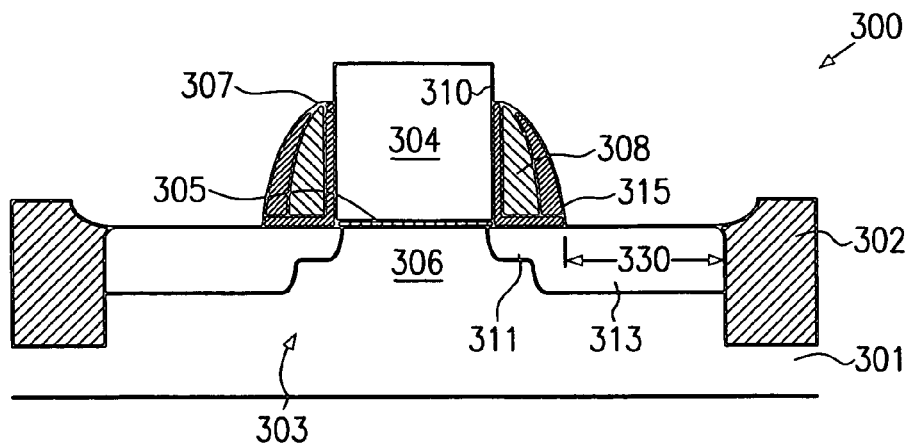

With reference to FIGS. 3a–3c, further illustrative embodiments of the present invention will be described. As noted before, components similar to those shown in FIGS. 2a–2c are denoted by the same reference numerals except for a "3" as the first number.

In FIG. 3a, the transistor 300 is shown in a manufacturing stage at which the first sidewall spacers 308 have been formed on the underlying liner 307 with a dielectric layer 315a formed above the trench isolation structure 302, the active region 303 and the gate electrode 304. The dielectric layer 315a is comprised of substantially the same material as the liner 307, exhibiting a predefined etch selectivity to the gate electrode 304 and the active region 303. In one particular embodiment, the dielectric layer 315a and the liner 307 may be substantially comprised of silicon dioxide.

Processes for manufacturing the transistor 300 may substantially comprise the same steps as already described with reference to FIG. 2a, wherein, advantageously, an anisotropic etch process for removing the liner 307 from horizontal surface portions may be omitted since the liner 307 may then be removed by a subsequent anisotropic etch process for forming second spacers from the layer 315a.

FIG. 3b schematically depicts the device 300 after completion of the anisotropic etch process. Thus, the second spacers 315 are formed adjacent to the first spacers 308 and, according to one embodiment, adjacent to the upper sidewall portion 310. Consequently, excessive anisotropic over-etching of the layer 315a for exposing the upper sidewall portion 310 may be avoided, thereby reducing damage to the exposed surface portions of the gate electrode 304 and the extensions 311. Thereafter, further implant and anneal cycles may be performed so as to form the drain and source regions 313. Prior to the formation of a metal silicide, the upper sidewall portion 310 may be exposed by performing an isotropic etch process, which is selective to the exposed surface portions of the gate electrode 304 and the drain and source regions 313, wherein the isotropic etch process may be performed as a dry etch process or as a wet chemical process. Typically, isotropic etch processes may exhibit an improved selectivity and create significantly less damage to exposed surfaces compared to a corresponding anisotropic etch process. Due to the isotropic nature, additionally, the width of the second spacer 315 is reduced, wherein the desired reduction in height and width may be controlled by correspondingly adjusting the etch time for a given isotropic etch recipe. In some embodiments, the second spacer may even be removed substantially completely. In one embodiment, the isotropic etch process may be designed as a wet chemical etch process, which also removes any material residues on exposed surface portions so that a corresponding clean process may be omitted.

FIG. 3c schematically shows the transistor 300 after completion of the above described etch process for reducing the size of the second sidewall spacer 315. As shown, the upper sidewall portion 310 is substantially completely exposed with a vertical extension that is defined by the parameters of the isotropic etch process. In one embodiment, the height of the recessed first spacer 308 is adjusted so as to substantially correspond to the vertical extension of the upper sidewall portion 310 exposed by the isotropic etch process. In this way, an under-etch area may be minimized, if under-etching is considered inappropriate. Otherwise, the under-etch area may be intentionally used to further increase the effective diffusion path as described with reference to FIGS. 2b–2c. As in the embodiments described earlier, a lateral extension 330 of the drain and source regions 313 is significantly increased. Hence, an improved controllability of the drain/source contact resistance is provided while at the same time process complexity may be reduced by eliminating an anisotropic etch process for removing the liner 307.

Figure 4A:
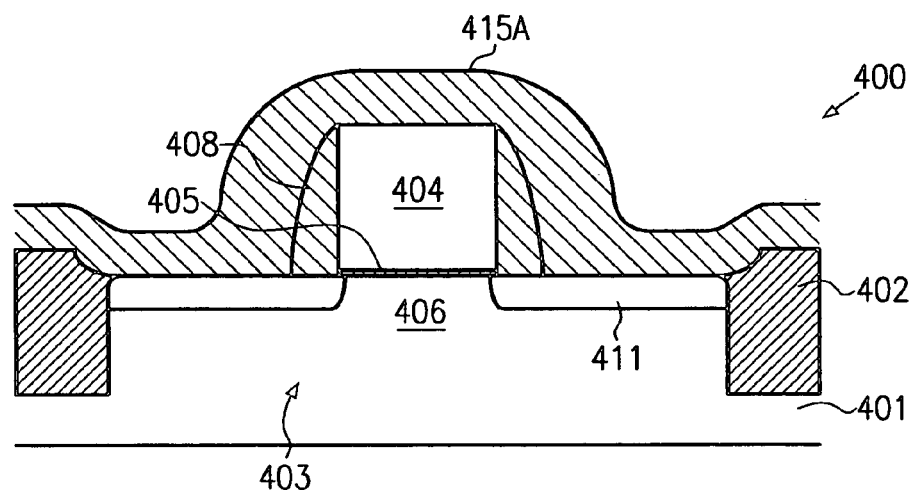
FIGS. 4a–4c schematically show various stages of manufacturing sidewall spacers, wherein first and second sidewall spacers are formed of substantially the same material in conformity with still further illustrative embodiments of the present inventions.
Figure 4B:
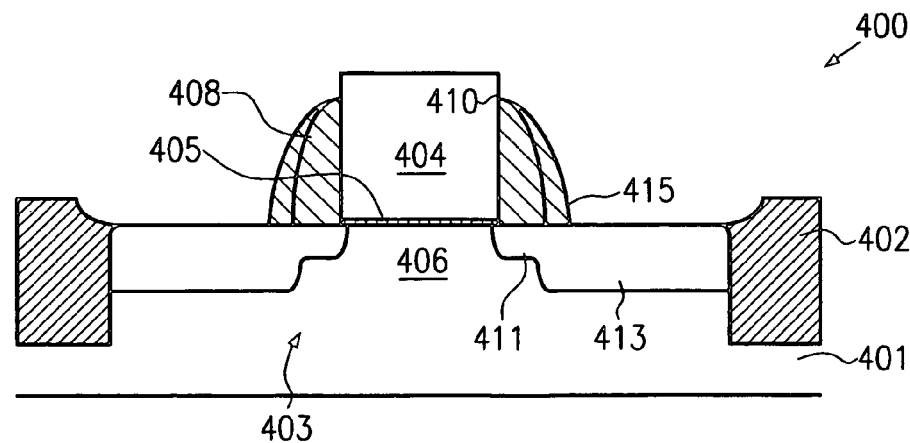
Figure 4C:
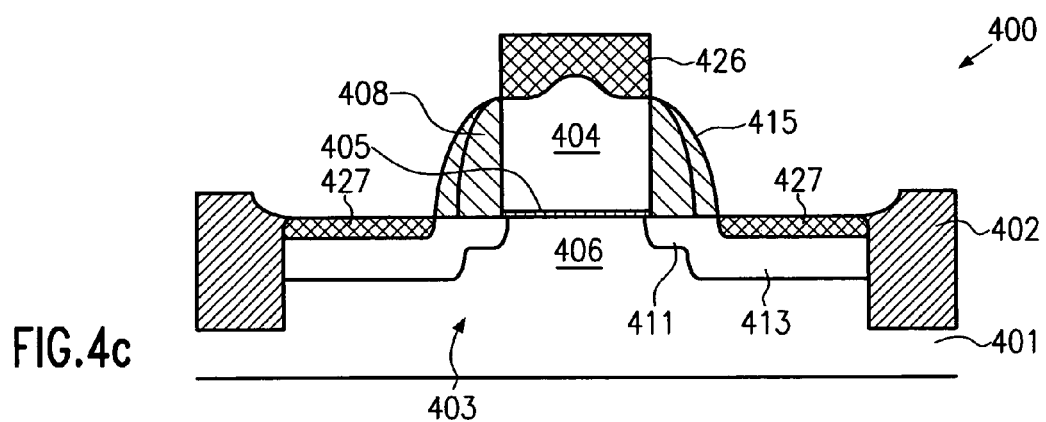

With reference to FIGS. 4a–4c, further illustrative embodiments of the present invention will now be described. As noted before, components similar to those shown in FIGS. 2a–2c and 3a–3c are denoted by the same reference numerals except for a "4" as the first number.

In FIG. 4a, the transistor 400 has a configuration that is similar to the configuration of the device 300 in FIG. 3a, except for the first sidewall spacer 408 being comprised substantially of the same material as the dielectric layer 415a. Moreover, the liner 307 may be omitted, as shown, or, in other embodiments, a corresponding liner may be formed that is also comprised of substantially the same material as the first sidewall spacer 408 and the dielectric layer 415a. In one particular embodiment, the first sidewall spacer 408 and the dielectric layer 415a are comprised of silicon dioxide. Although in some embodiments (not shown), the first sidewall spacer 408 may be formed as a recessed spacer, in view of a reduced anisotropic etch time during the formation of the sidewall spacer 408, it may be advantageous for other embodiments to provide the same spacer covering substantially all of the sidewalls of the gate electrode 404, as is shown in FIG. 4a. Thereafter, a selective anisotropic etch process may be carried out to form second sidewall spacers adjacent to the first sidewall spacer 408.

FIG. 4b schematically shows the transistor 400 after completion of the anisotropic etch process, wherein, in one embodiment, as shown, an over-etch time is provided so as to expose the upper sidewall portion 410, thereby forming recessed sidewall spacers 408 and 415. In other embodiments, however, the anisotropic etch process may be carried out so as to not substantially expose the upper sidewall portion 410 similarly as is described with reference to FIG. 3b. After final implantation and anneal cycles for forming the drain and source regions 413, a further isotropic clean or etch process may be performed to remove oxide residues from exposed surface portions or, when the sidewall spacers 408 and 415 have not been recessed during the preceding anisotropic etch, to expose the upper sidewall portion 410, thereby also reducing the width of the sidewall spacer 415 and possibly that of the sidewall spacer 408, depending on process requirements. Regarding the isotropic etch process for cleaning and/or exposing the upper sidewall portion 410, the same criteria as previously pointed out with reference to FIG. 3b also apply in this case. In one embodiment, the size of the upper sidewall portion 410 may be adjusted independently from the finally desired width of the sidewall spacer 415 in that a first part of the upper sidewall portion 415 is cleared by the anisotropic etch process and the remaining part is exposed by the isotropic etch process, which also provides the required reduction in width of the sidewall spacer 415 and possibly of the spacer 408.

FIG. 4c schematically shows the transistor 400 after completion of the isotropic clean/etch process and after completion of the silicidation process, wherein an increased metal silicide region 426 is formed in the gate electrode 404 and corresponding metal silicide regions 427 with increased lateral extension are formed in the drain and the source regions 413.

As a result, the present invention provides a technique that allows the efficient enlargement of a semiconductor surface portion for metal diffusion so as to form a metal/semiconductor compound in these regions, thereby effectively reducing the sheet resistance thereof. In particular, the resistance of polysilicon gate electrodes may be significantly reduced by more efficiently exposing an upper sidewall portion thereof, so that an enhanced diffusion of, for example, cobalt or other appropriate refractory metals occurs, and thus the corresponding silicidation is significantly enhanced. This is accomplished in that an outer sidewall spacer of two sidewall spacers formed adjacent to each other is comprised of substantially the same material as a liner or an innermost layer of a sidewall spacer so that the material removal of the outer sidewall spacer may also efficiently remove material of the liner or innermost sidewall spacer. At the same time, process complexity is substantially not increased or, in some embodiments, may even be reduced. It should be appreciated that the above-described embodiments may readily be combined in any appropriate manner. In particular, the above embodiments may be applied to sidewall spacer techniques requiring the formation of three or more sidewall spacers to accomplish a superior transistor performance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a recessed first sidewall spacer adjacent to a sidewall of a polysilicon line formed above a substrate, said first sidewall spacer exposing an upper sidewall portion of said polysilicon line;
    forming a second sidewall spacer comprised of silicon dioxide adjacent to said first sidewall spacer, said second sidewall spacer having a predefined etch selectivity with respect to said polysilicon line and said substrate, wherein forming said second sidewall spacer includes depositing a silicon dioxide layer over said polysilicon line and said first recessed sidewall spacer and anisotropically etching said silicon dioxide layer, whereby an etch chemistry is selective to silicon;
    reducing a size of said second sidewall spacer by a selective etch process according to said predefined etch selectivity so as to expose at least said upper sidewall portion; and
    forming a metal silicide region at least on said exposed upper sidewall portion.

2. The method of claim 1, wherein forming said recessed first sidewall spacer includes:
    forming a conformal silicon dioxide layer on said polysilicon line;
    depositing a silicon nitride layer over said polysilicon line; and
    anisotropically etching said silicon nitride layer until said upper sidewall portion is exposed.

3. The method of claim 1, wherein said second sidewall spacer is comprised of silicon dioxide.

4. The method of claim 1, further comprising performing a selective isotropic etch process to remove silicon dioxide prior to forming said metal suicide region, wherein said upper sidewall portion is substantially completely exposed.

5. The method of claim 4, further comprising forming doped regions adjacent to the polysilicon line.

6. The method of claim 5, wherein said first and second sidewall spacers are used as implantation masks during the formation of said doped regions.

7. The method of claim 5, further comprising forming metal silicide regions in said doped regions substantially at the same time when forming said metal silicide region in said polysilicon line.

8. The method of claim 7, wherein a lateral extension of said metal silicide regions in said doped regions is adjusted by controlling silicon dioxide removal during said selective etch process for reducing the size of said second sidewall spacer.

9. A method, comprising:
    forming a silicon dioxide liner on sidewalls of a polysilicon line formed above a silicon region;
    forming a recessed first sidewall spacer on said silicon dioxide liner, said first sidewall spacer being comprised of a material that may be selectively etched with respect to silicon dioxide;
    forming a silicon dioxide sidewall spacer adjacent to said first sidewall spacer; and
    selectively removing said silicon dioxide layer at least on portions of said polysilicon line not covered by said first sidewall spacer.

10. The method of claim 9, wherein forming a silicon dioxide sidewall spacer includes depositing a silicon dioxide layer and partially removing silicon dioxide by an anisotropic etch process.

11. The method of claim 10, wherein said anisotropic etch process is selective with respect to silicon and said anisotropic etch process is performed to expose an upper portion of said polysilicon line.

12. The method of claim 9, wherein selectively removing silicon dioxide includes substantially completely removing silicon dioxide from a top surface of said polysilicon line, sidewall portions not covered by said first sidewall spacer and surface portions of the silicon region not covered by said first and second sidewall spacers.

13. The method of claim 12, wherein said selective removal is a selective wet etch process.

14. The method of claim 13, wherein a lateral extension of the silicon region not covered by said first and second sidewall spacers is adjusted in conformity with a specified target value by controlling said selective wet etch process.

15. The method of claim 12, further comprising depositing a metal over said polysilicon line and said silicon region and forming a metal silicide on regions that are substantially devoid of silicon dioxide.

16. The method of claim 12, wherein a thickness of said dioxide liner is selected so as to enable an at least partial filling in of a refractory metal after completion of said selective wet etch process.

17. The method of claim 9, further comprising depositing a metal over said polysilicon line and forming a metal silicide at least in portions not covered by said first and second sidewall spacers.

18. The method of claim 9, further comprising forming doped areas of a specified doping profile in said silicon region.

19. The method of claim 18, wherein at least one of said first and second sidewall spacers acts as a mask for laterally patterning said specified doping profile.

20. The method of claim 19, wherein said doped areas are formed by ion implantation.

21. A method of forming a field effect transistor, the method comprising:
    forming a gate electrode on a gate insulation layer above a region, said region being comprised of a specified semiconductive material;
    forming a first recessed sidewall spacer, comprising at least a layer of a first dielectric material in contact with said gate electrode, and a second sidewall spacer, said second sidewall spacer being comprised of said first dielectric material, said first dielectric material having a specified etch selectivity with respect to said specified semiconductive material;
    forming a drain region and a source region;
    selectively removing a portion of said first dielectric material to substantially completely expose an upper sidewall portion of said gate electrode; and forming a metal/semiconductor compound region in said gate electrode, wherein said exposed upper sidewall portion promotes metal diffusion into said gate electrode, wherein said drain and source regions are substantially completely exposed by an isotropic selective etch process of at least said second sidewall spacer prior to forming said metal/semiconductor compound region.

22. The method of claim 21, wherein forming said first recessed sidewall spacer includes depositing a layer of material on said gate electrode and anisotropically etching said layer of material to form said first recessed sidewall spacer.

23. The method of claim 21, wherein forming said second sidewall spacer includes depositing a layer comprised of said first dielectric material and anisotropically etching said deposited layer material, whereby said predefined etch selectivity substantially suppresses an etching of said gate electrode and said drain and source regions.

24. The method of claim 23, wherein a height of said second sidewall spacer is adjusted by controlling an etch time of said anisotropic etch process.

25. The method of claim 21, wherein said isotropic selective etch process is a wet chemical etch process on the basis of hydrogenated fluoride.

26. The method of claim 21, wherein a lateral extension of a substantially completely exposed area of said drain and source regions is adjusted in conformity with a predefined target value by controlling said isotropic selective etch process.

27. The method of claim 21, wherein said first dielectric material comprises silicon dioxide.

28. The method of claim 21, wherein said first sidewall spacer is comprised of silicon nitride.

29. A method, comprising:
 forming a recessed first sidewall spacer adjacent to a sidewall of a polysilicon line formed above a substrate, said first sidewall spacer exposing an upper sidewall portion of said polysilicon line, wherein forming said recessed first sidewall spacer comprises:
  forming a conformal silicon dioxide layer on said polysilicon line;
  depositing a silicon nitride layer over said polysilicon line; and
  anisotropically etching said silicon nitride layer until said upper sidewall portion is exposed;
 forming a second sidewall spacer adjacent to said first sidewall spacer, said second sidewall spacer having a predefined etch selectivity with respect to said polysilicon line and said substrate;
 reducing a size of said second sidewall spacer by a selective etch process according to said predefined etch selectivity so as to expose at least said upper sidewall portion; and
 forming a metal suicide region at least on said exposed upper sidewall portion.

30. A method of forming a field effect transistor, the method comprising:
 forming a gate electrode on a gate insulation layer above a region, said region being comprised of a specified semiconductive material;
 forming a first recessed sidewall spacer, comprising at least a layer of a first dielectric material in contact with said gate electrode, and a second sidewall spacer, said second sidewall spacer being comprised of said first dielectric material, said first dielectric material having a specified etch selectivity with respect to said specified semiconductive material, wherein forming said first recessed sidewall spacer includes depositing a layer of material on said gate electrode and anisotropically etching said layer of material to form said first recessed sidewall spacer;
 forming a drain region and a source region;
 selectively removing a portion of said first dielectric material of at least said second sidewall spacer to substantially completely expose an upper sidewall portion of said gate electrode; and
 forming a metal/semiconductor compound region in said gate electrode, wherein said exposed upper sidewall portion promotes metal diffusion into said gate electrode.

31. A method of forming a field effect transistor, the method comprising:
 forming a gate electrode on a gate insulation layer above a region, said region being comprised of a specified semiconductive material;
 forming a first recessed sidewall spacer, comprising at least a layer of a first dielectric material in contact with said gate electrode, and a second sidewall spacer, said second sidewall spacer being comprised of said first dielectric material, said first dielectric material having a specified etch selectivity with respect to said specified semiconductive material, wherein forming said second sidewall spacer includes depositing a layer of said first dielectric material and anisotropically etching said first dielectric material, whereby said predefined etch selectivity substantially suppresses an etching of said gate electrode and said drain and source regions;
 forming a drain region and a source region;
 selectively removing a portion of said first dielectric material of at least said second sidewall spacer to substantially completely expose an upper sidewall portion of said gate electrode; and
 forming a metal/semiconductor compound region in said gate electrode, wherein said exposed upper sidewall portion promotes metal diffusion into said gate electrode.

32. The method of claim 31, wherein a height of said second sidewall spacer is adjusted by controlling an etch time of said anisotropic etch process.

33. A method of forming a field effect transistor, the method comprising:
 forming a gate electrode on a gate insulation layer above a region, said region being comprised of a specified semiconductive material;
 forming a first recessed sidewall spacer comprised of silicon nitride, comprising at least a layer of a first dielectric material in contact with said gate electrode, and a second sidewall spacer, said second sidewall spacer being comprised of said first dielectric material, said first dielectric material having a specified etch selectivity with respect to said specified semiconductive material;
 forming a drain region and a source region;
 selectively removing a portion of said first dielectric material of at least said second sidewall spacer to substantially completely expose an upper sidewall portion of said gate electrode; and
 forming a metal/semiconductor compound region in said gate electrode, wherein said exposed upper sidewall portion promotes metal diffusion into said gate electrode.

* * * * *

UNITED STATES PATENT AND TRADEMARK OFFICE
CERTIFICATE OF CORRECTION

PATENT NO. : 7,005,358 B2
DATED : February 28, 2006
INVENTOR(S) : Thorsten Kammler et al.

It is certified that error appears in the above-identified patent and that said Letters Patent is hereby corrected as shown below:

Column 11,
Line 49, change "suicide" to -- silicide --.

Column 13,
Line 17, after "deposited layer" delete "material".
Line 55, change "suicide" to -- silicide --.

Signed and Sealed this

Twenty-third Day of May, 2006

JON W. DUDAS
*Director of the United States Patent and Trademark Office*